United States Patent
Kitajima (10) Patent No.: US 8,686,463 B2
(45) Date of Patent: Apr. 1, 2014

(54) CAPPING SYSTEM

(71) Applicant: Mitsubishi Electric Corporation, Tokyo (JP)

(72) Inventor: Nobuyuki Kitajima, Nagasaki (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/688,321

(22) Filed: Nov. 29, 2012

(65) Prior Publication Data

US 2013/0247342 A1    Sep. 26, 2013

(30) Foreign Application Priority Data

Mar. 26, 2012   (JP) .................................. 2012-068774

(51) Int. Cl.
*H01L 33/58* (2010.01)
*H01L 33/60* (2010.01)
*H01L 31/0232* (2006.01)

(52) U.S. Cl.
CPC ............... *H01L 33/60* (2013.01); *H01L 33/58* (2013.01); *H01L 31/0232* (2013.01)
USPC ............... 257/99; 257/98; 257/431; 257/433; 257/E33.013; 257/E31.127

(58) Field of Classification Search
CPC .......................... H01L 31/0232; H01L 33/586
USPC .............. 257/98–99, 431–433, 499, E31.108, 257/127, 33.013
See application file for complete search history.

(56) References Cited

U.S. PATENT DOCUMENTS

| 5,606,182 A * | 2/1997 | Yoshida et al. ................. 257/99 |
| 2002/0181853 A1* | 12/2002 | Ido et al. ......................... 385/19 |
| 2005/0013556 A1* | 1/2005 | Yoshida et al. ................. 385/88 |
| 2005/0242359 A1* | 11/2005 | Yoshida et al. ................. 257/99 |
| 2006/0292846 A1* | 12/2006 | Pinto et al. .................... 438/597 |
| 2011/0129141 A1* | 6/2011 | Hiroi et al. .................... 382/149 |
| 2011/0291144 A1* | 12/2011 | Yoshida et al. ................. 257/98 |
| 2011/0298915 A1* | 12/2011 | Hiroi et al. ...................... 348/80 |
| 2012/0304435 A1* | 12/2012 | Okada et al. ............... 29/407.09 |

FOREIGN PATENT DOCUMENTS

| JP | 5-67690 A | 3/1993 |
| JP | 11-16806 A | 1/1999 |
| JP | 2005-302890 A | 10/2005 |

* cited by examiner

*Primary Examiner* — Michael Lebentritt
(74) *Attorney, Agent, or Firm* — Leydig, Voit & Mayer, Ltd.

(57) ABSTRACT

A capping system includes: a moving portion moving a stem, on which an optical semiconductor element is mounted, horizontally; a fixer fixing a cap having a window, on the stem; a camera taking an image of the cap and the stem from above the cap and the stem; a detector detecting whether the optical semiconductor element is present within a visual field of the camera; and a searching action controller controlling the moving portion to move the stem so the detector searches the optical semiconductor element. The searching action controller causes searching radially and outwardly from a search starting point.

6 Claims, 7 Drawing Sheets

CAPPING SYSTEM

BACKGROUND OF THE INVENTION

1. Field of the Invention

The present invention relates to a capping system assembling a cap to the stem.

2. Background Art

In the fabrication of optical semiconductor devices, a capping system is used when a cap is assembled to the stem (for example, refer to Japanese Patent Laid-Open No. 5-67690). In the capping system, the cap is aligned to the stem by image recognition using a camera.

Figure 13:
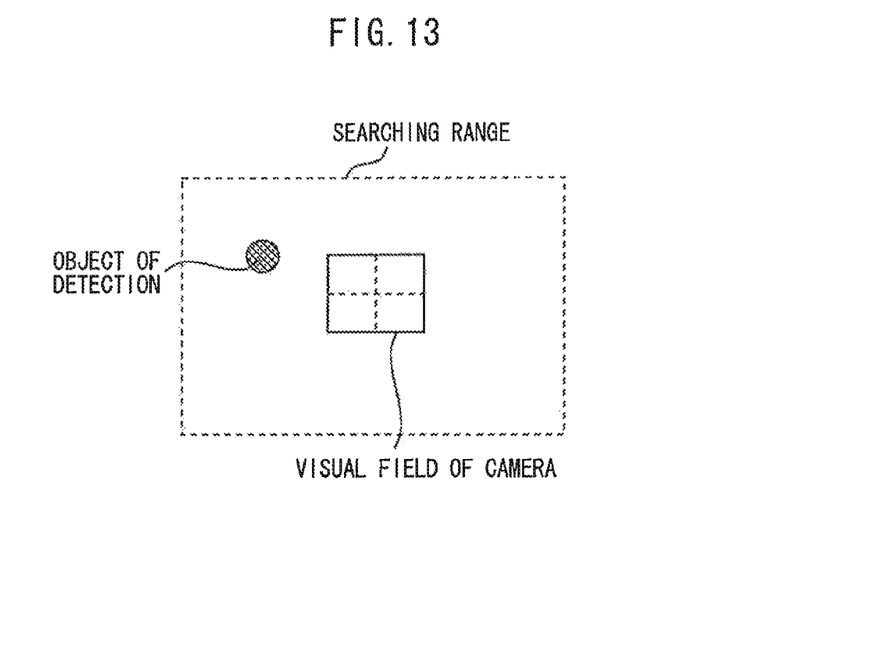
FIG. 13 is an illustration showing the visual field of the camera and a searching range.
Figure 14:
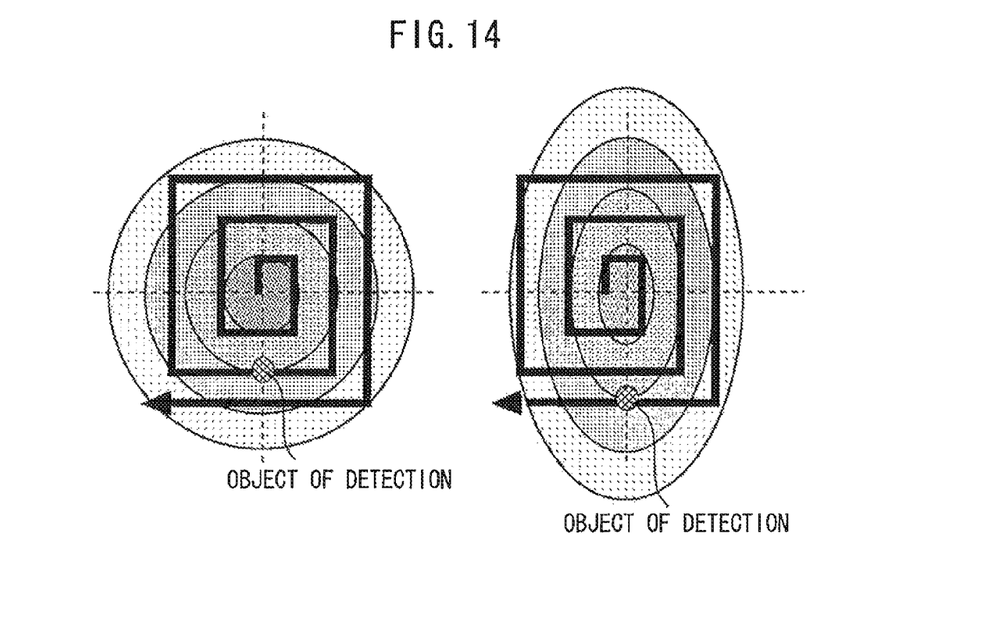
FIG. 14 is illustrations showing a conventional searching method.

FIG. 13 is an illustration showing the visual field of the camera and a searching range. When the searching range wherein an object of detection is present is wider than the visual field of the camera, the object of detection must be moved into the visual field of the camera. FIG. 14 is illustrations showing a conventional searching method. As shown, the object of detection is searched by spiral locus centered by the search starting point.

SUMMARY OF THE INVENTION

When the distribution of the detected positions is normal distribution of a concentric pattern as shown in the left side of FIG. 14, the detected positions could be effectively searched by the spiral locus. However, when the distribution of the detected positions is not normal distribution of a concentric pattern as shown in the right side of FIG. 14, the detected positions could not be effectively searched by the spiral locus.

Furthermore, there are cases wherein the distribution of the detected positions is different from the distribution simulated by the population (lot) of the material. If previously set initial search starting point was different from the distribution center of actually detected position, there was a problem wherein the searching time was extended.

Furthermore, when searching operation was varied depending on the position distribution of the objects of detection, a control program corresponding to respective searching operations had to be prepared. Therefore, the control program for devices was complicated.

In view of the above-described problems, a first object of the present invention is to provide a capping system which can shorten the searching time. A second object of the present invention is to provide a capping system wherein a control program can be used in common for a plurality of searching operations.

According to the present invention, a capping system includes: a moving portion moving a stem mounting an optical semiconductor element toward a horizontal direction; a fixer fixing a cap having a window under a state wherein the stem is covered with the cap; a camera taking an image of the cap and the stem from above; a detector detecting whether the optical semiconductor element is present within a visual field of the camera; and a searching action controller controlling the moving portion to move the stem to make the detector perform a searching operation for searching the optical semiconductor element. The searching action controller performs the searching operation radially and outward from a search starting point.

The present invention makes it possible to shorten the searching time.

Other and further objects, features and advantages of the invention will appear more fully from the following description.

DETAILED DESCRIPTION OF THE PREFERRED EMBODIMENTS

A capping system according to the embodiments of the present invention will be described with reference to the drawings. The same components will be denoted by the same symbols, and the repeated description thereof may be omitted.

First Embodiment

Figure 1:
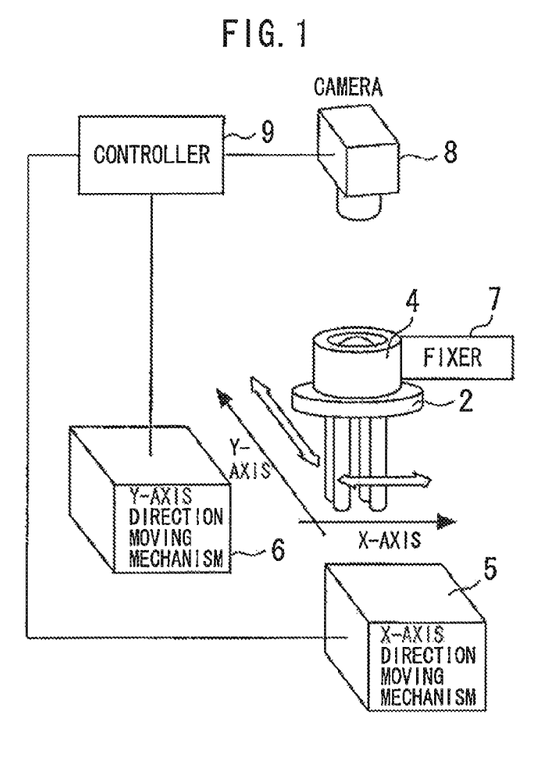
FIG. 1 is a perspective view showing a capping system according to the first embodiment of the present invention.
Figure 2:
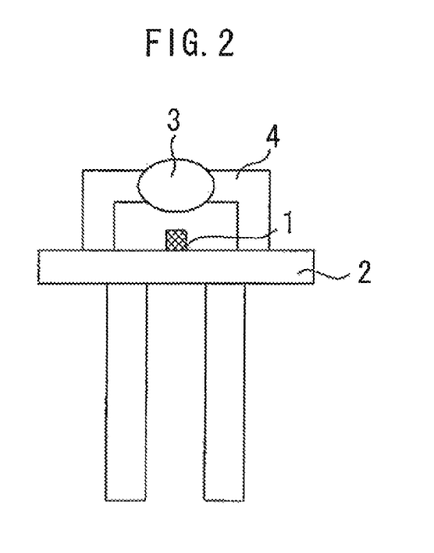
FIG. 2 is a sectional view showing a stem mounting an optical semiconductor element.

FIG. 1 is a perspective view showing a capping system according to the first embodiment of the present invention. FIG. 2 is a sectional view showing a stem mounting an optical semiconductor element. The optical semiconductor element 1 such as a laser diode is mounted on the stem 2. The capping system is a portion for assembling a cap 4 having a window 3 (lens) to this stem 2. The cap 4 is cylindrical, and the optical semiconductor element 1 is included therein. The optical semiconductor element 1 in the cap 4 can be viewed from above via the window 3 of the cap 4.

An X-axis direction moving portion 5 moves the stem 2 mounting the optical semiconductor element 1 toward the horizontal X-axis, and a Y-axis direction moving portion 6 moves the stem 2 toward the horizontal Y-axis. At this time, the cap 4 is fixed under the state wherein the stem 2 is covered with the cap 4. A fixed CCD camera 8 takes an image of the cap 4 and the stem 2 from above. A controller 9 controls the X-axis direction moving portion 5 and the Y-axis direction moving portion 6 depending on the image taken by the CCD camera 8.

Figure 3:
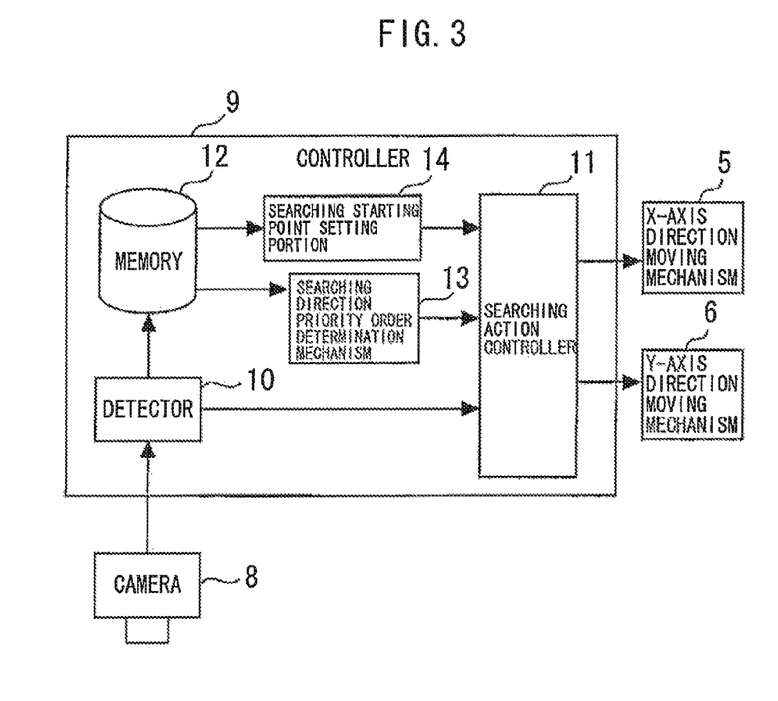
FIG. 3 is a block diagram showing a control circuit according to the first embodiment of the present invention.

FIG. 3 is a block diagram showing a control circuit according to the first embodiment of the present invention. A detector 10 detects whether the optical semiconductor element 1 is present within the visual field of the CCD camera 8. A searching action controller 11 controls the X-axis direction moving portion 5 and the Y-axis direction moving portion 6 to move the stem 2 to make the detector 10 perform the searching operation for searching the optical semiconductor element 1. When the optical semiconductor element 1 enters within the visual field of the CCD camera 8 and the detector 10 detects the optical semiconductor element 1, the searching action controller 11 ends the searching operation.

Figure 4:
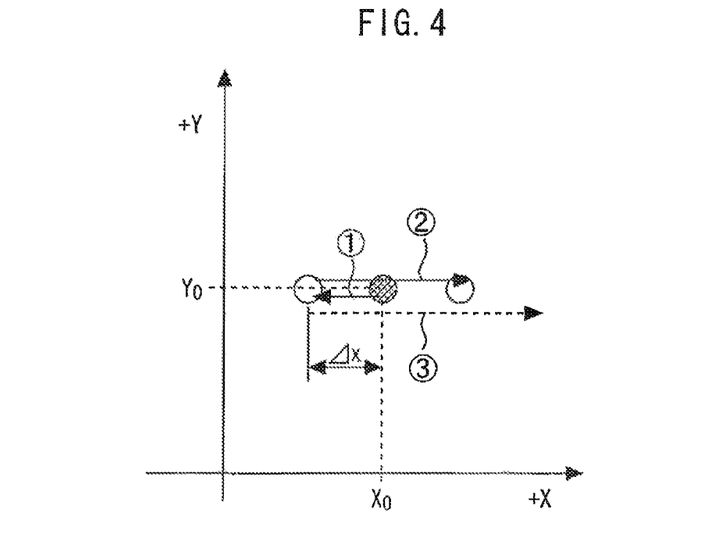
FIG. 4 is a diagram showing the searching operation of the X-direction.
Figure 5:
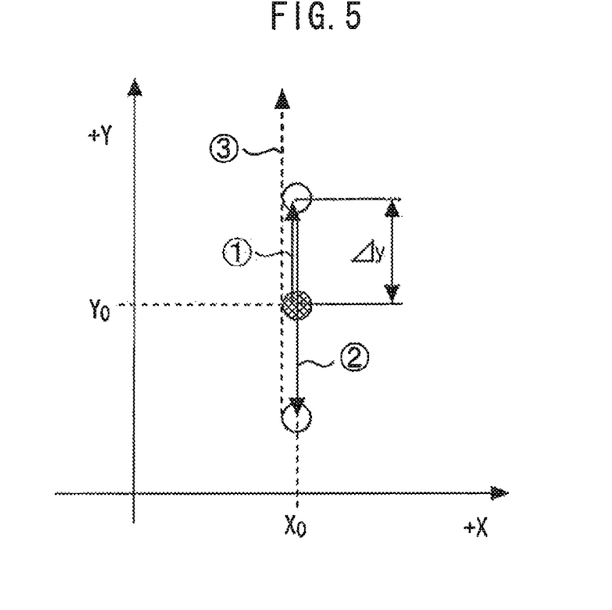
FIG. 5 is a diagram showing the searching operation of the Y-direction.
Figure 6:
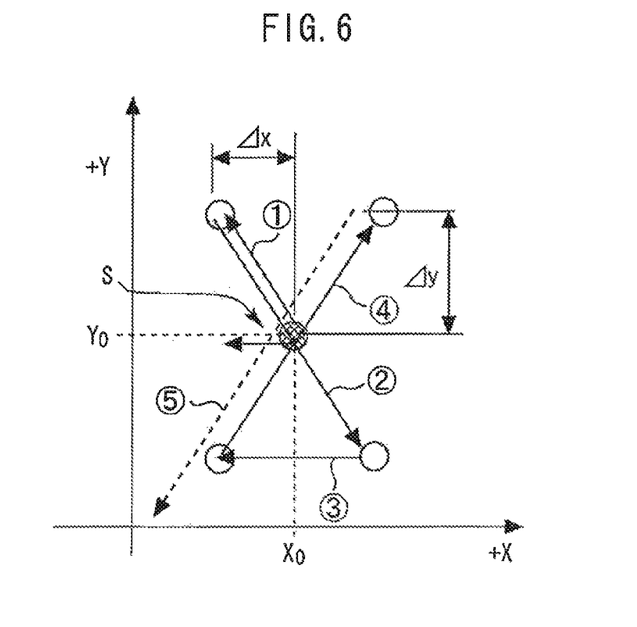
FIG. 6 is a diagram showing the searching operation of the combination of the X-direction and the Y-direction.

The searching action controller 11 performs searching operation radially and outward using the optimal search starting point S as the starting point. FIG. 4 is a diagram showing the searching operation of the X-direction. FIG. 5 is a diagram showing the searching operation of the Y-direction. FIG. 6 is a diagram showing the searching operation of the combination of the X-direction and the Y-direction.

A memory 12 memorizes the detected positions of the optical semiconductor element 1 on the each of a plurality of stems 2. A searching direction priority order determination portion 13 determines the priority of the orientations for performing searching operation depending upon the distribution of the detected positions in the searching range of the two-dimensional plane (Y-Y plane). Specifically, the priority of the orientations in which the frequency of the detected positions is high is made high. The searching action controller 11 performs the searching operation along the searching orientations in descending order of priority.

Figure 7:
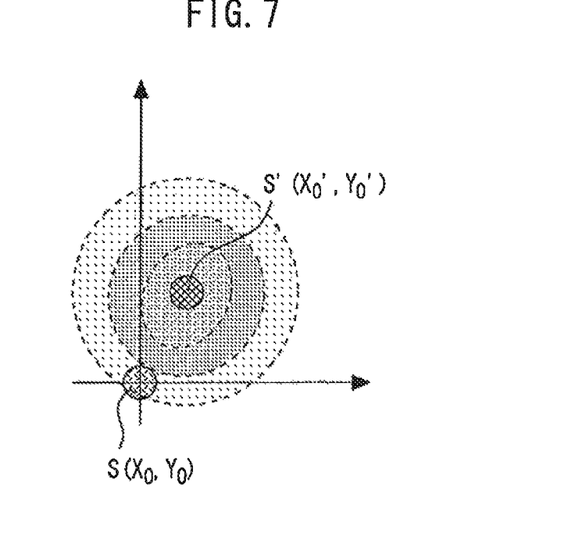
FIG. 7 is a graph showing the distribution of the search starting points and the detected positions.

FIG. 7 is a graph showing the distribution of the search starting points and the detected positions. In the case wherein the initial search starting point S $(X_O, Y_O)$ is different from the distribution center of the detected positions S' $(X_O', Y_O')$, a search starting point setting portion 14 resets the center of the distribution to the search starting point. In particular, from the first to the n batches, the initial search starting point S is made to be the origin, and the searching operation is performed (step S1). Next, in the n+1 batch, the distribution center S' of the detected positions of past n batches is obtained, and the search starting point is replaced to S' to perform the searching operation (step S2). Then, in the n+2 batch, the center of the distribution S" of the distribution center in the detected positions of the past n+1 batches is replaced to S", and the searching operation is performed (step S3). Thereafter, steps S2 and S3 are repeated. Thereby, in the searching operations after n+1 batch, the search starting point is optimized.

In the first embodiment, since searching can be efficiently performed using an optimal search starting point S as the origination radially and outward, the searching time can be shortened. In addition, by determining the priority order of the orientations to perform the searching operation corresponding to the distribution of the detected positions, the time for searching can be further shortened. Furthermore, by setting the distribution center of the detected positions as the search starting point, the time for searching can be further shortened.

Second Embodiment

Figure 8:
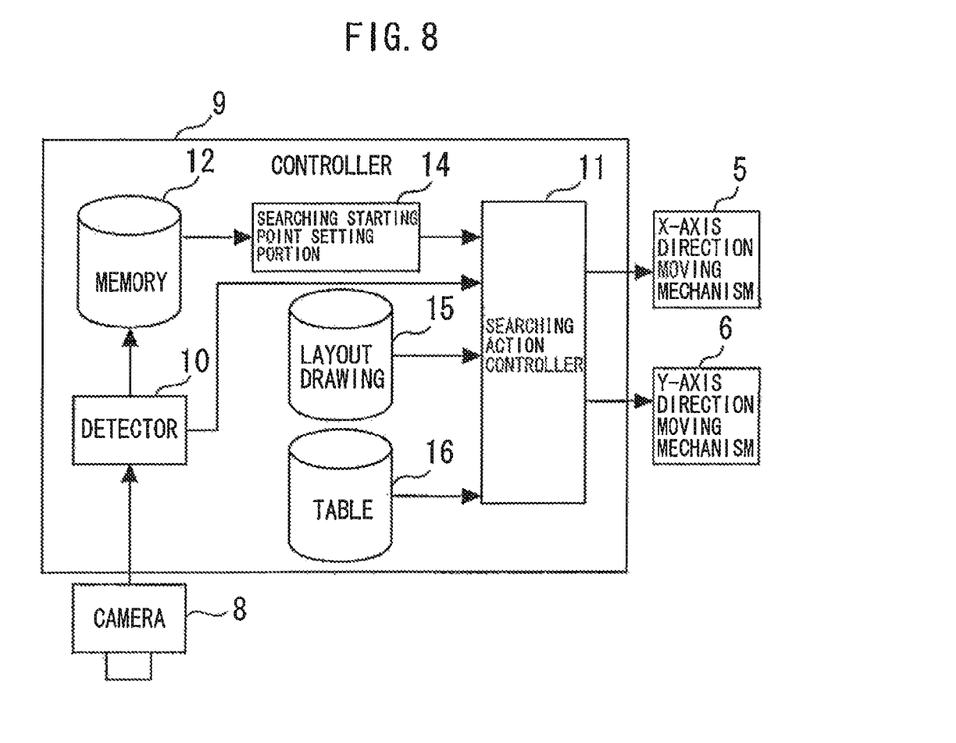
FIG. 8 is a block diagram showing the control circuit according to the second embodiment of the present invention.

FIG. 8 is a block diagram showing the control circuit according to the second embodiment of the present invention. In place of the searching direction priority order determination portion 13 in the first embodiment, a layout drawing 15 and a table 16 are provided. The searching action controller 11 performs the searching operation on the basis of the layout drawing 15 and the table 16.

Figure 9:
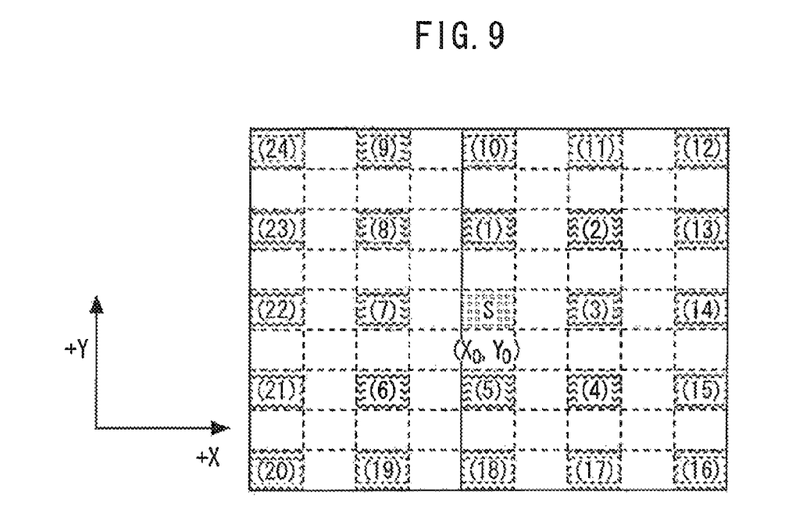
FIG. 9 is a diagram showing an example of allocation plans.

FIG. 9 is a diagram showing an example of allocation plans. The layout drawing 15 is that the searching range of the two-dimensional plane centering on the search starting point is divided in grid, and tag numbers are allocated respectively. The table 16 is what searching orders are allocated to respective tag numbers. The searching action controller 11 performs searching operations to the positions corresponding to the order of the tag numbers allocated by the table 16 referring to the layout drawing 15.

Figure 10:
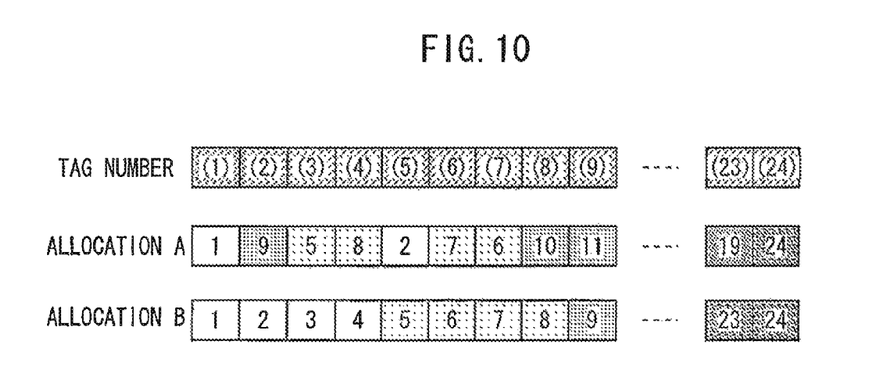
FIG. 10 is a diagram showing an example of the table.
Figure 11:
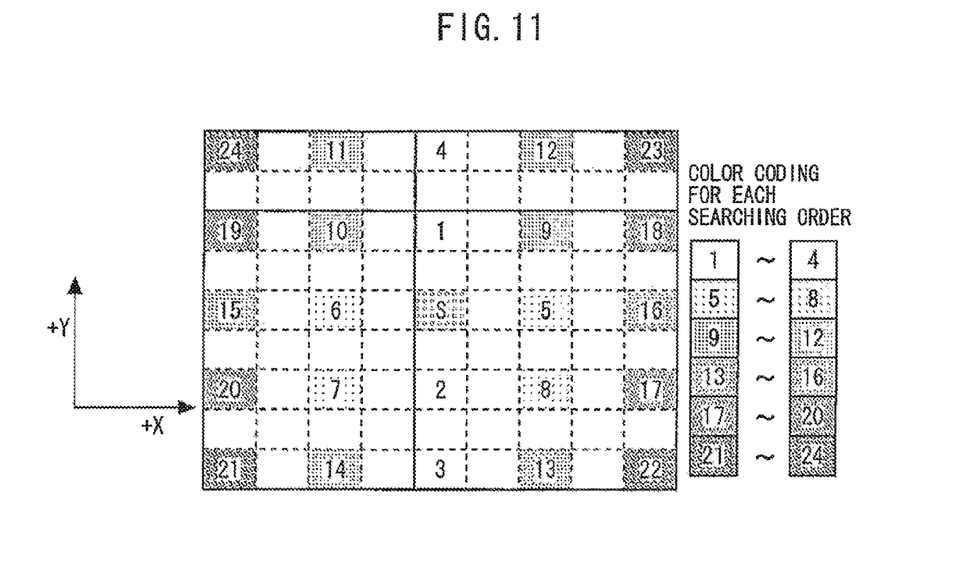
FIG. 11 is a layout drawing wherein the searching orders of the allocation A.

FIG. 10 is a diagram showing an example of the table. The allocation A allocates the searching order to the respective tag numbers so that the Y-axis direction is preferential. FIG. 11 is a layout drawing wherein the searching orders of the allocation A. The allocation A can shorten the searching time when the distribution of the searching locations is eccentrically located.

Figure 12:
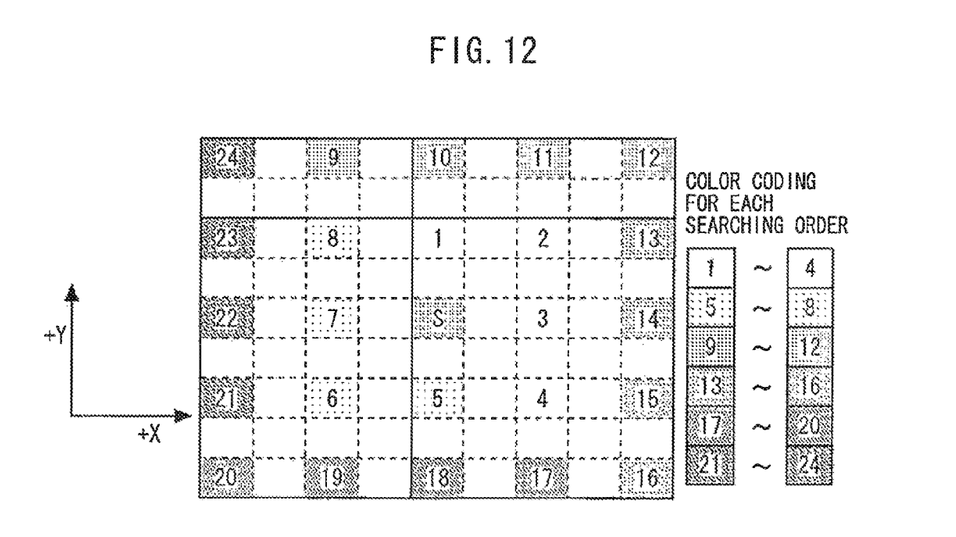
FIG. 12 is a diagram showing the layout drawing wherein the searching order of the allocation B.

The allocation B allocates the searching order to respective tag numbers so that the searching operations are performed in the spiral locus making the search starting point to be the starting point. FIG. 12 is a diagram showing the layout drawing wherein the searching order of the allocation B. The allocation B can shorten the searching time when the distribution of the detected positions is the concentric normal distribution.

In the present embodiment, it is enough to prepare one control program that performs searching operations in the order of tag numbers as the control program in the searching action controller 11. Therefore, a control program can be used in common for a plurality of searching operations. In addition, the setting of a plurality of tables can be possible. Since the order of the points to perform searching operation can be optionally determined, the freedom of the searching order can be improved.

Furthermore, in the same manner as the first embodiment, when the initial search starting point S is different from the center S' of the distribution of the detected positions, the search starting point setting portion 14 resets the center of distribution of the detected positions. Thereby, the time for searching can be shortened.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-068774, filed on Mar. 26, 2012, including specification, claims, drawings, and summary, on which the Convention priority of the present application is based, is incorporated herein by reference in its entirety.

What is claimed is:

1. A capping system comprising:
   a moving portion moving a stem, on which an optical semiconductor element is mounted, horizontally;
   a fixer fixing a cap having a window to the stem so the cap covers the stem;
   a camera taking an image of the cap and the stem from above the cap and the stem;
   a detector detecting whether the optical semiconductor element is present within a visual field of the camera; and
   a searching action controller controlling the moving portion to move the stem for searching the optical semiconductor element, wherein the searching action controller controls searching radially and outwardly from a search starting point.

2. The capping system according to claim 1, further comprising:
   a memory memorizing detected positions of optical semiconductor elements mounted on respective stems; and
   a searching direction priority order determination portion determining priority of searching orientations for the searching, depending upon distribution of the detected positions, wherein the searching action controller controls the searching along the searching orientations in descending order of priority.

3. The capping system according to claim 1, further comprising:
a memory memorizing detected positions of optical semiconductor elements mounted on respective stems; and
a search starting point setting portion setting a distribution center of the detected positions as the search starting point.

4. A capping system comprising:
a moving portion moving a stem, on which an optical semiconductor element is mounted, horizontally;
a fixer fixing a cap having a window to the stem so the cap covers the stem;
a camera taking an image of the cap and the stem from above the cap and the stem;
a detector detecting whether the optical semiconductor element is present within a visual field of the camera;
a searching action controller controlling the moving portion to move the stem for searching the optical semiconductor element;
a layout drawing in which searching range of a two-dimensional plane, centering on a search starting point, is divided into a grid, and tag numbers are allocated respectively; and
a table in which searching orders are allocated to respective tag numbers, wherein the searching action controller controls searching for positions corresponding to the tag numbers allocated by the table referring to the layout drawing.

5. The capping system according to claim 4, further comprising:
a memory memorizing detected positions of optical semiconductor elements mounted on respective stems; and
a search starting point setting portion setting a distribution center of the detected positions as the search starting point.

6. A capping system comprising:
a moving portion moving a stem, on which an optical semiconductor element is mounted, horizontally;
a fixer fixing a cap having a window to the stem so the cap covers the stem;
a camera taking an image of the cap and the stem from above the cap and the stem;
a detector detecting whether the optical semiconductor element is present within a visual field of the camera;
a searching action controller controlling the moving portion to move the stem for searching the optical semiconductor element;
a memory memorizing detected positions of optical semiconductor elements mounted on respective stems; and
a search starting point setting portion setting a distribution center of the detected positions as a search starting point, wherein the searching action controller controls the searching from the search starting point.

* * * * *